United States Patent [19]
Schweda et al.

[11] Patent Number: 5,387,881
[45] Date of Patent: Feb. 7, 1995

[54] ATOMIC FREQUENCY STANDARD

[75] Inventors: Hartmut S. Schweda, Le Landeron; Giovanni Busca, Neuchâtel; Pascal Rochat, Marin, all of Switzerland

[73] Assignee: Observatoire Cantonal de Neuchatel, Neuchatel, Switzerland

[21] Appl. No.: 28,140

[22] Filed: Mar. 9, 1993

[30] Foreign Application Priority Data

Mar. 16, 1992 [FR] France ................ 92 03210

[51] Int. Cl.$^6$ .............. H01S 1/06; H03B 17/00; H03L 7/26
[52] U.S. Cl. .............................. 331/94.1; 331/3
[58] Field of Search .......................... 331/94.1, 3

[56] References Cited

U.S. PATENT DOCUMENTS

| | | | |
|---|---|---|---|
| 3,382,452 | 5/1968 | Rempel et al. | 331/3 |
| 3,798,565 | 3/1974 | Jechart | 331/94.1 |
| 4,123,727 | 10/1978 | Peters | 331/94.1 |
| 4,947,137 | 8/1990 | Busca et al. | 331/94.1 |

FOREIGN PATENT DOCUMENTS 966126 8/1964 United Kingdom .

OTHER PUBLICATIONS

Proceedings of the 41th Annual Frequency Control Symposium–1987, pp. 75–81, New York, USA, "Hydrogen Maser for Radio Astronomy" by Peters, et al. (month unknown).

Radio Engineering and Electronic Physics, vol. 26, No. 11, Nov. 1981, Washington, US, p. 151, by Bochkov, et al. "Small–resonator Hydrogen Maser".

Proceedings of the 41st Annual Frequency Control Symposium–1987, pp. 25–35, New York, USA, "Ultra-sensitive frequency discrimination in a diode laser pumped Rb97 atomic clock" by Hashimoto, et al. (month unknown).

*Primary Examiner*—Andrew M. Dolinar
*Attorney, Agent, or Firm*—Pollock, Vande Sande & Priddy

[57] ABSTRACT

The atomic frequency standard has a heating element (58) surrounding an enclosure (43) which defines a microwave resonance cavity (42). The heating element supplies heat to an absorption cell (41) located in the cavity. The absorption cell (41) is surrounded by electrodes (45a–45d) which act to enhance and orient the oscillating magnetic field in the region of the absorption cell. Thermally conductive members (47a–47d) connect the electrodes (45a–45d) to the enclosure (43) to better control the temperature of the cell while retaining the advantages due to the presence of the electrodes (45a–45d).

20 Claims, 3 Drawing Sheets

ATOMIC FREQUENCY STANDARD

TECHNICAL FIELD

The present invention relates to atomic frequency standards and in particular to atomic frequency standards including a resonance cavity, storage means in the resonance cavity for the storage of atomic or molecular elements, and heating means to supply heat to the resonance cavity.

BACKGROUND OF THE INVENTION

Atomic frequency standards are devices characterised by very precise and accurate frequencies of operation, the basic resonance system of which is an atom or a molecule experiencing a transition between two well defined energy levels. The general principle of operation of frequency standards is described in the book "The Quantum Physics of Atomic Frequency Standards" by J. Vanier and C. Andion, published by Adam Hilger, Bristol and Philadelphia, 1989.

Embodiments of atomic frequency standards using a gas cell and a maser are described in Swiss Patent no. 640 370 and U.S. Pat. No. 4,316,153 respectively.

In order to illustrate the operation of a known atomic frequency standard, there will now be described an atomic frequency standard employing a gas cell having reference to FIG. 1 of the accompanying drawings.

The frequency standard shown schematically in FIG. 1 comprises essentially an atomic resonator 10, a crystal oscillator and associated frequency multiplier or synthetiser circuitry 11, and a feedback circuit 12. The atomic resonator 10 consists principally of a lamp 13, a filter cell 14, a microwave cavity 15, an absorption cell 16 and a photoelectric cell 17. A power supply 18 provides the energy necessary to drive the oscillator and associated circuitry 11, lamp 13 and control the temperature of the various components of the atomic resonator 10. A conventional heating coil 18a is supplied from and controlled by a power supply circuit 18.

Another power supply circuit 19 provides power to supply a magnetic field to the microwave cavity 15 via a coil 19a. Further, the microwave cavity 15 is surrounded by a magnetic shield 20b to block external magnetic fields from influencing the operation of the atomic resonator 10.

In the atomic frequency standard shown in FIG. 1, there is produced by optical pumping a population inversion between the hyperfine levels of the ground state of the atoms which are generally alkali metals such as potassium, sodium or rubidium. In the case of a frequency standard using rubidium, a standard optical pumping arrangement as will now be described is used.

The absorption cell 16 contains the isotope rubidium 87 the spectrum of which comprises the two hyperfine components A and B, and an appropriate buffer gas such as nitrogen. The absorption cell 16 is illuminated by the rubidium 87 lamp 13 through the filter cell 14 which contains a rubidium 85 vapour, the absorption spectrum of which contains the hyperfine components a and b. The components A and a exist practically in coincidence whilst the components B and b are completely separated. The component A of the emission spectrum of the lamp 13 is therefore essentially eliminated by the filter cell 14 so that the light which reaches the absorption cell 16 is predominantly constituted by light at the frequency of the component B. Only the atoms of the rubidium 87 of the absorption cell 16 situated in the lower hyperfine level (F=1) absorb light and are transported into higher states.

After the rubidium atoms in the absorption cell 16 have been thus excited, they relax to either the upper hyperfine level (F=2) or to the lower hyperfine level of the ground state by collisions with nitrogen molecules of the buffer gas. Since these atoms are immediately excited by the arrival of the light, the lower level (F=1) is depopulated to the benefit the upper level (F=2). Because of this asymmetry in the pumping light, there is thus brought about a population inversion of these two levels and the absorption cell 16 becomes practically transparent to residual radiation from the lamp 13.

The absorption cell 16 is arranged in the microwave cavity 15 which is excited by the circuitry 11 to a frequency close to 6835 MHz, which frequency corresponds to the separation energy of the hyperfine levels $F=1$, $m_f=0$ and $F=2$, $m_f=0$ which brings about the hyperfine transition accompanied by the emission of electromagnetic radiation between these two levels. As soon as the atoms which participate in the stimulated emission arrive at the lower hyperfine level (F=1), they are optically pumped and transported into the excited states.

During this process, the magnetic shield 20b reduces the ambiant external field to a low level, and a small, uniform, axial magnetic field is produced by the magnetic field coil 19a driven by the power supply circuit 19. The magnetic field thus produced in the absorption cell 16 displaces the energy values of the hyperfine levels according to the known Zeeman effect and therefore adjusts the exact frequency of the electromagnetic radiation emitted in the above described stimulated emission.

The greater the number of stimulated emissions, the greater will be quantity of light absorbed in the absorption cell 16 and the smaller will be the quantity of light arriving at the photoelectric cell 17. The current produced by the photoelectric cell 17 is therefore at a minimum when the frequency of the excitation signal of the microwave cavity 15 is at the transition frequency.

The quartz oscillator 21 of the circuitry 11 produces a signal at 5 MHz, which is modulated in a phase modulator 22 to a relatively low frequency (about 100 Hz to 1 kHz) produced by a low frequency generator 23. The modulated signal is applied to a multiplier/synthesizer 24 to obtain a signal having the stimulated emission frequency of 6835 MHz. It is this signal which is employed in order to excite the microwave cavity 15.

The signal furnished by the photoelectric cell 17 is received by an amplifier 25 of the feedback circuit 12, then applied to a phase comparator 26 which also receives a reference signal from the generator 23 of the circuitry 11 in a manner to bring about a synchronous detection enabling determination of whether the carrier frequency of the signal applied to the microwave cavity 15 is well centered on the hyperfine transition frequency (6835 MHz). Any shifting is indicated by an error signal at the output of the phase comparator 26. This signal is sent to an integrator 27, which is employed in order to control a Zener diode 28 coupled to the quartz oscillator 21 and which modifies the frequency of the latter so as to maintain the multiplied frequency of the quartz oscillator 21 centered onto the frequency of the hyperfine transition of the rubidium 87.

The stability and precision of the frequencies of operation of the atomic frequency standard of FIG. 1 depend upon the interaction of the atoms or molecules in the absorption cell 16 with the electromagnetic field in the microwave cavity 15 whilst the atoms or molecules is undergoing the above-mentioned stimulated emissions. The electromagnetic field in the microwave cavity 15 has essentially the same frequency and wave length as the atomic or molecular hyperfine transition radiation, and the physical size of the microwave cavity is related to the wave length of the radiation.

The stability and precision of the frequency of operation of the atomic resonator 10 also depend on good temperature control of the lamp 13, the absorption cell 16 and the filter cell 14. This is connected with the fact that the hyperfine transition frequency as interrogated by the multiplied frequency of the quartz oscillator 21 and detected by the light signal impinging upon the photoelectric cell 17 is influenced by the simultaneously occuring optical pumping process. The hyperfine transition frequency is slightly shifted depending on the spectrum and the intensity of the light absorbed, which is in turn a function of the temperatures of the lamp 13, filter 14 and the absorption cell 16. Furthermore, shifts in the hyperfine transition frequency due to collisions with the buffer gas are a function of the pressure and temperature of the rubidium 87 and buffer gas in the absorption cell 16.

In some prior art atomic resonators not requiring heating and/or temperature control of the atomic or molecular elements in the absorption cell, electrodes have been located circumferentially around the absorption cell within the microwave cavity in order to reduce the physical dimensions of the microwave cavity, and to intensify and orient the electromagnetic field in the region of the absorption cell within the microwave cavity. The resulting concentration of the electromagnetic field in the region of the absorption cell optimizes the filling factor and the quality factor of the microwave cavity resonator. The filling factor is the ratio of the total magnetic energy in the space occupied by the atomic or molecular elements in the absorption cell, to the total magnetic energy in the resonator; the higher the filling factor, the better the response of the atomic resonator. The quality factor is given by the ratio of the frequency of the considered resonant mode of the cavity to its resonance line-width and determined by the ratio of the energy stored to the power lost via the cavity.

The electrodes of such prior art resonators however are bonded to the absorption cell, and secured in position relative to each other by the use of a fixative such as an appropriate resin. The dielectric properties of the fixative used diminish the intensity and uniformity of the electromagnetic field in the region of the absorption cell. They are furthermore electrically and thermally insulated from the cavity walls and are designed according to design equations which rely upon this electrical and thermal separation.

Such electrodes also provide a thermal mass within the microwave cavity which makes accurate control of the temperature of the microwave cavity, and the absorption cell within, more difficult. The electrodes act to block the transfer of the heat from the walls of the microwave cavity to the interior of the cavity and to the absorption cell located thereat thereby reducing the thermal response time of the atomic resonator, and storing and subsequently radiating heat when it is desired to reduce the heating in the microwave cavity.

In prior art atomic resonators, it is further necessary to provide energy to heat not just the contents of the absorption cell where the temperature is important but also the other areas in the microwave cavity where accurate control of temperature is not required.

In addition, the fact that areas of the microwave cavity other that the absorption cell are being heated means that initially the warm-up time of the prior art atomic frequency standards is greater than desired.

SUMMARY OF THE INVENTION

The object of the present invention is to provide an atomic frequency standard which alleviates or overcomes at least some of the disadvantages present in the prior art.

With this object in mind, the present invention provides an atomic frequency standard comprising a resonance cavity within an enclosure, storage means in said resonance cavity for the storage of atomic or molecular elements, field generation means to subject said storage means to a uniform oscillating magnetic field, state selection means for placing said elements in a preselected energy state, means for stimulating transitions from said preselected energy state to another preselected energy state at a predetermined frequency, and heating means for supplying heat to said enclosures, characterized in that at least one electrode is disposed about said storage means so as to thereby enhance said oscillating magnetic field of said stimulated transitions in the region of said storage means, said at least one electrode being connected to said enclosure by one or more thermally conductive members so as to thereby supply said heat to said storage means.

The following description refers in more detail to the various features of the present invention. To facilitate an understanding of the invention, reference is made in the description to the accompanying drawings where the atomic frequency standard is illustrated in a preferred embodiment. It is to be understood however that the atomic frequency standard of the present invention is not limited to the preferred embodiment as illustrated in the drawings.

DETAILED DESCRIPTION OF THE INVENTION

Figure 1:
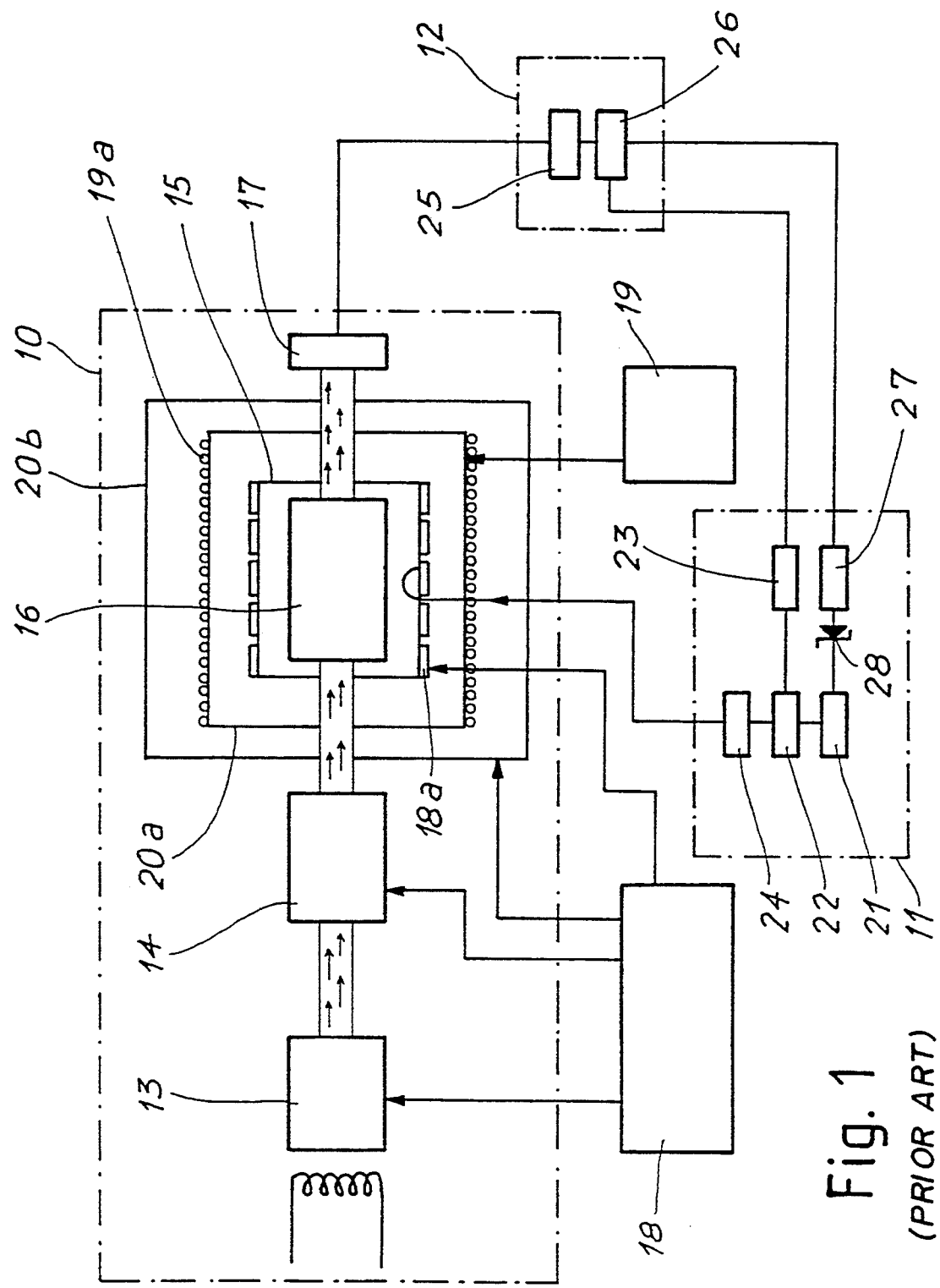
FIG. 1, already described, shows schematically an atomic frequency standard according to the prior art.
Figure 2:
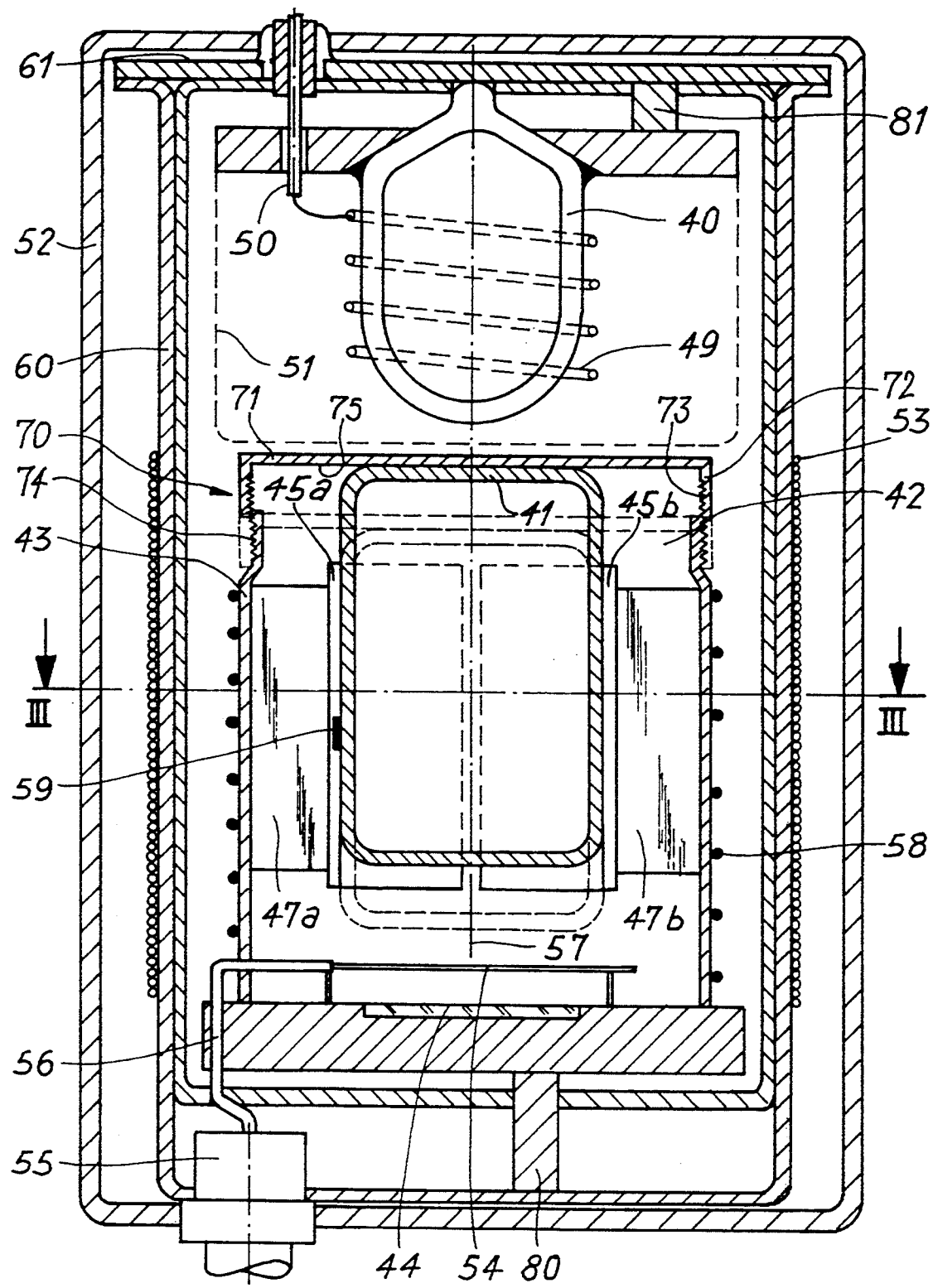
FIG. 2 is a cross-sectional side view of an atomic resonator for use in the atomic frequency standard of the present invention.

The arrangement according to the invention of the atomic frequency standard as shown in FIG. 2 comprises essentially a lamp 40, an absorption cell 41, a microwave cavity 42 having a wall 43, a photoelectric cell 44, electrodes 45a to 45d and connecting members 47a to 47d.

The lamp 40 contains principally rubidium 87, or a mixture of rubidium 87 and rubidium 85, as well as an appropriate triggering gas such as argon. It is placed within an excitation coil 49, connected to cable 50, being the inductive load of a radio frequency oscillator having a frequency between about 100 and 150 MHz. A grid 51 is arranged about the assembly in order to avoid radiation of the signal towards the absorption cell 41 and the photoelectric cell 44.

A standard heating circuit (not shown) comprising a heating resistance and a temperature sensor is employed to maintain the lamp at a constant temperature, which may be 140° C.

The absorption cell 41 is placed facing the lamp 40. In the illustrated embodiment, the absorption cell 41 contains rubidium 85 and rubidium 87 as well as an appropriate buffer gas which may be nitrogen or a mixture of nitrogen and methane. It has, for example, a diameter of 14 mm and a length of 25 mm, giving an inner volume of approximately 3 cm$^3$.

The atoms of rubidium 85 situated in the portion of the absorption cell 41 closest to the lamp 40 absorb the spectral component A of the latter which brings about filtering and the atoms of rubidium 87 located in the part of the absorption cell 41 furthest from the lamp 40 absorb the spectral component B of the latter, this bringing about the optical pumping required to select the state of the rubidium 87 atoms. Alternatively, an isotopic filter may be combined with an alkali source so that a lamp is provided which supplies pre-filtered light to the absorption cell 41. Yet another alternative is to use a diode laser as the light source, thereby removing the need for any filtering.

The microwave cavity 42 is protected from exterior magnetic fields by a magnetic screen 52. The microwave cavity 42 is subjected to a uniform magnetic field created by the winding 53, and a microwave frequency field created by a microwave loop 54 energized by an external oscillator via a connector 55 and a coaxial cable 56. The loop 54 may comprise an SRD (Step Recovery Diode) which multiplies the frequency of the signal furnished by the oscillator and which thus enables the use of a relatively low frequency oscillator.

The microwave cavity 42 is provided with a heating and temperature control means in order to maintain the temperature of the absorption cell 41 at its normal operating value, which may be 85° C. in the case of a rubidium 87 gas cell. Electric current may be provided in a bifilar wound heating wire 58 applied around the wall 43 of the microwave cavity 42, in order to supply heat to the microwave cavity 42. A temperature sensor 59 provides feedback to the heating and temperature control means in order to regulate the temperature of the microwave cavity 42.

The microwave cavity 42 is excited at a resonance frequency of 6835 Mhz, corresponding to the hyperfine transition frequency of the level F=2, $m_f$=0 to the level F=1, $m_f$=0 for the atoms of rubidium 87 in the absorption cell 41.

The absorption of the spectral component B by the atoms of rubidium 87 in the absorption cell 42 is detected by the photoelectric cell 44. This absorption signal is employed in a well known manner to slave the frequency of the interrogation signal emitted by the loop 54 to the hyperfine transition frequency of the level F=2, $m_f$=0 to the level F=1, $m_f$=0 of the rubidium 87.

The electrodes 45a to 45d are located about the absorption cell 41 about the longitudinal axis 57 of the absorption cell 41, and confine the oscillating magnetic field of the microwave cavity 42 to a desirable and uniform orientation with respect to the magnetically oriented rubidium 87 atoms in the absorption cell 41, as well as enhance the intensity of the field in the region of the absorption cell 41 so that optimum coupling occurs between the field and the atoms of rubidium 87 stored in the cell 41. It is to be appreciated that the electrodes 45a to 45d are merely illustrative of the electrodes which may be used and that other orientations of the electrodes about the absorption cell than that illustrated are possible. Any number of electrodes may be used around the absorption cell 41, and each electrode so used may vary in shape, size and spacing from the other electrodes.

The connecting members 47a to 47d join the electrodes 45a to 45d to the wall 43 of the microwave cavity 42 and support the electrodes in position fixed relative to each other, overcoming the need to use resin or other fixation means, which disturbs the uniformity and intensity of the oscillating magnetic field in the region of the absorption cell 42.

The connecting members 47 and 48 are made of thermally conductive material and preferably have a contacting surface contiguous to the electrodes, which surface is substantially equal to the surface of the respective electrode, in order to efficiently transfer heat supplied by the heating coil 58 from the wall 43 of the microwave cavity 42 to the electrodes 45a to 45d.

Preferably, the connecting members 47a to 47d fill almost the entire space between the external surface of the electrodes and the internal surface of the wall 43, which further enhances the heat transfer. The absorption cell 41 may thus be directly heated by the electrodes 45a to 45d, minimizing the warm-up time of the atomic resonator, reducing the attendant frequency error and providing for more accurate control and homogeneity of the temperature of the rubidium and buffer gas in the absorption cell 41. In addition, the power necessary to heat the absorption cell 41 may be reduced as the cell 41 only need be kept at the desired temperature rather that the whole microwave cavity.

In the presence of an appropriate oscillating magnetic field in the microwave cavity 42, the electrodes constitute a kind of peripheral electric circuit allowing a current to flow circularly within the electrodes, thereby characterizing a certain inductance. A peripheral electric current also flows between the electrodes about the longitudinal axis of the coil of the cell 41, thus defining a certain capacitance due to the dielectric gaps prevailing between the extremities of the electrodes. The appropriate positioning and dimensions of those electrodes affects the values of these capacitances and inductances, and may thus determine the dominant resonance frequency of the microwave cavity 42.

Due to these capacitances, a certain electric field is caused to be present between the gaps. The values of these capacitances, and hence the resonance frequency of the microwave cavity 42, is thus affected by the dielectric value of the material through which this electric field passes. The wall of the absorption cell 41 preferably has a dielectric constant which differs from that through which the electric field passes when the cell 41 is absent. It can therfore be seen that the relative movement of the cell 41 and the electrodes 45a–45d will vary the proportion of electric field passing through the cell 41, thus altering the capacitances created by the electrodes 45a–45d and changing the resonance frequency of the microwave cavity 42.

The atomic frequency standard shown in FIG. 2 includes means 70 for positioning the storage means 41 with respect to the electrodes 45a–45d. The positioning means 70 comprises a cap member 71 having and annular skirt 72 on the inner surface of which is a screw thread 73. The outer surface of the enclosure 43 has also has a screw thread 74 for cooperating with the screw thread 73 of the cap 71. The absorption cell 41 is secured to the inner surface 75 of the cap 71. In this way, the relative screwing or un-screwing of the cap 71 and the enclosure 42 causes the absorption cell 41 to be respectively inserted or withdrawn from a position between the electrodes 45a–45d, thereby altering the proportion of electric field passing through the absorption cell 41. Variations in the wall thickness of the absorption cell 41, the dimensions of the electrodes 45a–45d and the dimensions of other components within the frequency standard which can affect the resonance frequency of the microwave cavity 42, can be compensated for by adjusting the position of the absorption cell 41.

The absorption cell 41 may be secured to the cap 71 by any convenient means. If the cell 41 is not supported by the cap 71 however, for example if the frequency standard is maintained in an inverted position to that shown in FIG. 2, the cell 41 need not be secured to the cap 71. In addition, other arrangements may be used to that shown in FIG. 2, in order to achieve relative movement between the cell 41 and the electrodes 45a–45d within the enclosure 43. For example, the absorption cell 41 may be secured to a cap-like member which cooperates with the inner wall of the container 60 and 61. These and other mechanical equivalents will be appreciated by a man skilled in the art as forming part of the present invention.

An embodiment of the present invention has been realised using four electrodes, each having a thickness of 0.8 mm and a length, in the direction of the longitudinal axis of the coil 58, of 12 mm. The gap between each electrode was 0.6 mm. The absorption cell used had a wall thickness of between 0.2 and 0.3 mm, and was made from a material having a dielectric constant of 4.5. In this exemplary arrangement, the pulling-range of the frequency standard, or in other words the difference in the resonance frequency of the microwave cavity 42 when the absorption cell 41 is completely inserted between the electrodes 45a–45d compared to when the cell 41 is completely withdrawn, was found to be 400 MHz.

In another embodiment of the present invention, the connecting members 47a to 47d, in conjunction with the electrodes 45a to 45d, may be used to support the absorption cell 41 within the microwave cavity 42. One or more of the electrodes may be fixed to the absorption cell to enable such support. Alternatively, the physical relation of two or more electrodes, or of one or more electrodes and the wall of the microwave cavity may be used to engage the cell therebetween and support the absorption cell 41. In this manner, the absorption cell may be positioned within the microwave cavity 42 so as to maximize the oscillating magnetic field in the region of the absorption cell 41.

Figure 3:
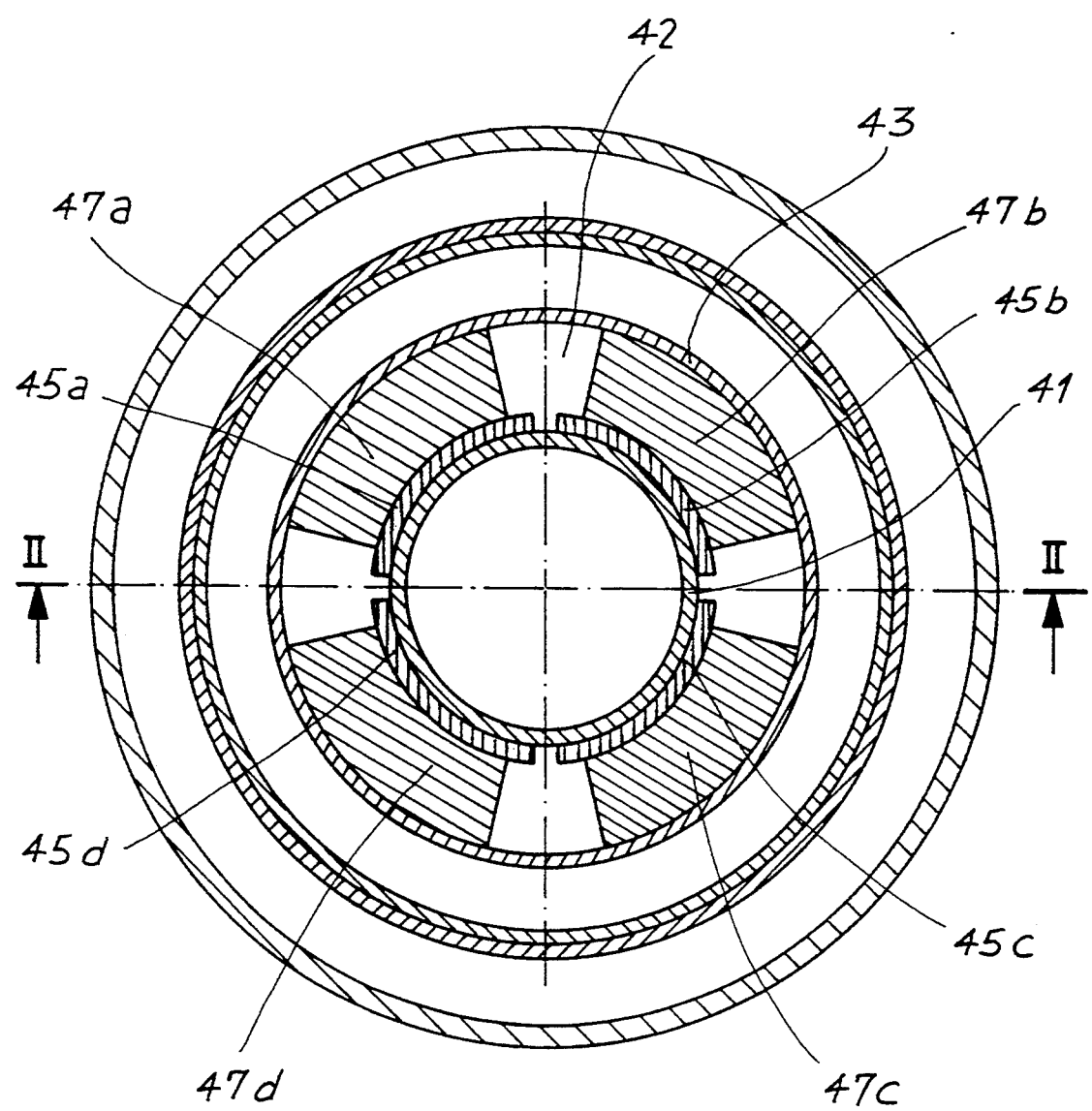
FIG. 3 is a cross-sectional plan view of the atomic resonator of FIG. 2.

In the arrangement shown in FIGS. 2 and 3, the oscillating magnetic flux created by the resonating structures of the electrodes 45a–45d and the members 47a–47d, is found to be optimal in the centre of the microwave cavity 42. The absorption cell 41 may thus be located there without the introduction of further support members which would cause additional dielectric losses and magnetic field perturbations.

In order to increase the structural rigidity and ease of manufacture of the atomic frequency standard of the present invention, the support members 47a–47d may be integral with the wall 43 of the microwave cavity 42. In the same fashion, the electrodes 45a–45d may also be integral with the support members 47a–47d.

The container formed by envelope 60 and cover 61 may be advantageously placed under vacuum, thereby providing several advantages over known atomic frequency resonators. These advantages are: firstly, that the thermal flux due to convertion between the lamp 40 and the cell 41 are eliminated enabling a more precise control of temperature; secondly, placing the container under a vacuum enables the lamp 40 and the cell 41 to be placed closer together without risk promoting a reduction in volume of the atomic frequency standard; thirdly, the temperature range within which the standard may be used and the frequency stability of the atomic resonator are improved; and, fourthly, the power consumption required by the atomic frequency standard is further reduced.

Advantageously, various elements of the atomic frequency standard within the container, such as the light source 40 and the microwave resonator 43, may be connected to the container 60 and 61, as shown in FIG. 2, by low thermal conductivity spacers 80 and 81. In this manner, the frequency standard within the container may be thermally separated from the container, and not subject to the same changes in temperature variation and physical expansion resulting from ambient pressure and temperature changes outside the container.

Instead of placing the container under vacuum, the container may also be filled with a gas of low thermal conductivity, such as xenon or other appropriate heavy molecular gas. This gas may be at atmospheric pressure. Filling the chamber with xenon enables the same advantages to be obtained by placing the chamber under a vacuum. At the same time, in this case, the need to use materials having low outgas properties is avoided.

Finally, it is to be understood that various modifications and/or additions may be made to the atomic frequency standard without departing from the ambit of the present invention as defined in the claims appended hereto. In particular, it is to be appreciated that the invention is not restricted in its scope to passive atomic frequency standards such as the rubidium gas cell standard, but is applicable to all atomic frequency standards in which oscillating magnetic field enhancing electrodes may be used.

What is claimed is:

1. An atomic frequency standard comprising:
   a resonance cavity within an enclosure;
   storage means in said resonance cavity for the storage of atomic or molecular elements;
   field generation means for subjecting said storage means to a uniform oscillating magnetic field;
   state selection means for placing said elements in a preselected energy state;
   means for stimulating transitions from said preselected energy state to another preselected energy state at a predetermined frequency;
   heating means for supplying heat to said enclosure; and,
   at least one electrode disposed-about said storage means so as to thereby enhance said oscillating magnetic field in the region of said storage means, said at least one electrode being connected to said enclosure by at least one thermally conductive member so as to thereby supply said heat to said storage means.

2. An atomic frequency standard according to claim 1, wherein said at least one member is integral with said enclosure.

3. An atomic frequency standard according to claim 1, where said at least one member is integral with said at least one electrode.

4. An atomic frequency standard according to claim 1 wherein said atomic frequency standard is a passive frequency device and said storage means comprises a gas cell containing an alkali metal in gaseous form.

5. An atomic frequency standard according to claim 1, wherein said storage means contains rubidium and a buffer gas.

6. An atomic frequency standard according to claim 1, wherein said state selection means and said storage means are placed in a container under vacuum.

7. An atomic frequency standard according to claim 6, wherein said state selection means and said enclosure are connected to said container by low thermal conductivity spacers.

8. An atomic frequency standard according to claim 1, wherein said state selection means and said storage means are placed in a container filled with a gas of low thermal conductivity.

9. An atomic frequency standard according to claim 8, wherein said state selection means and said enclosure are connected to said container by low thermal conductivity spacers.

10. An atomic frequency standard according to claim 1, wherein said state selection means comprises a light source having a predetermined spectral component which produces a population inversion in said light source by optical pumping.

11. An atomic frequency standard according to claim 10, wherein said light source comprises an alkali metal lamp.

12. An atomic frequency standard according to claim 10, wherein said light source comprises an alkali source and an isotopic filter.

13. An atomic frequency standard according to claim 10, wherein

14. An atomic frequency standard according to claim 1, wherein said at least one electrode is supported within said resonance cavity by said at least one member.

15. An atomic frequency standard according to claim 1, wherein of said storage means is supported within said resonance cavity by said at least one electrode.

16. An atomic frequency standard according to claim 1, wherein said storage means is supported centrally within said resonance cavity.

17. An atomic frequency standard according to claim 1, wherein each said electrode has a plurality of extremities, adjacent ones of said extremities passing an electric field therebetween, at least some of said electric field passing through said storage means, and wherein said atomic frequency standard further comprises means for positioning said storage means with respect to said at least one electrode so as to vary the proportion of said electric field passing through said storage means.

18. An atomic frequency standard according to claim 17, wherein said positioning means is releasably engagable in a plurality of positions with said enclosure.

19. An atomic frequency standard according to either said positioning means and said enclosure are mutually engagable by means of cooperating screw-threads, and wherein said positioning of said storage means is performed by the screwing or un-screwing of said positioning means and said enclosure.

20. An atomic frequency standard according to claim 17, wherein said positioning means comprises a cap having an interior surface and an exterior surface, said cap being securable to said enclosure and, said storage means being engagable with said interior surface.

* * * * *

UNITED STATES PATENT AND TRADEMARK OFFICE
CERTIFICATE OF CORRECTION

PATENT NO. : 5,387,881
DATED : February 7, 1995
INVENTOR(S) : HARTMUT S. SCHWEDA et al.

It is certified that error appears in the above-indentified patent and that said Letters Patent is hereby corrected as shown below:

Column 8, line 62, change "disposed-about" to --disposed about--.

Column 10, line 5, after "wherein" insert --said light source comprises a diode laser.--;

line 28, change "either" to --claim 17, wherein--; and line 37, after "enclosure" insert --,--, and after "and" delete ",".

Signed and Sealed this

Fourth Day of April, 1995

Attest:

BRUCE LEHMAN

Attesting Officer     Commissioner of Patents and Trademarks